United States Patent
Kerwin et al.

(12) United States Patent
(10) Patent No.: US 6,890,832 B1
(45) Date of Patent: May 10, 2005

(54) RADIATION HARDENING METHOD FOR SHALLOW TRENCH ISOLATION IN CMOS

(75) Inventors: David B. Kerwin, Colorado Springs, CO (US); Bradley J Larsen, Woodland Park, CO (US)

(73) Assignee: Aeroflex UTMC Microelectronic Systems, Inc., Colorado Springs, CO (US)

( * ) Notice: Subject to any disclaimer, the term of this patent is extended or adjusted under 35 U.S.C. 154(b) by 333 days.

(21) Appl. No.: 10/292,787

(22) Filed: Nov. 12, 2002

(51) Int. Cl.$^7$ ............................................... H01L 21/76
(52) U.S. Cl. ...................... 438/425; 438/400; 438/424; 438/426; 438/429; 438/439; 438/443; 438/911
(58) Field of Search ........................ 438/400, 424–426, 438/429, 439, 443, 911

(56) References Cited

U.S. PATENT DOCUMENTS

| | | | |
|---|---|---|---|
| 4,728,619 A | 3/1988 | Pfiester et al. ................ | 437/34 |
| 4,728,998 A | 3/1988 | Strain ........................... | 357/16 |
| 5,358,894 A | 10/1994 | Fazan et al. ................... | 437/70 |
| 5,360,749 A | 11/1994 | Anjum et al. ................. | 437/24 |
| 5,407,838 A | 4/1995 | Ohnishi et al. ............... | 437/25 |
| 6,063,690 A | 5/2000 | Woodruff et al. ........... | 438/426 |
| 6,607,961 B1 * | 8/2003 | Gris ............................ | 438/365 |

* cited by examiner

*Primary Examiner*—Jack Keith
(74) *Attorney, Agent, or Firm*—Peter J. Meza; William J. Kubida; Hogan & Hartson LLP

(57) ABSTRACT

A radiation-hardened STI process includes implanting a partially formed wafer with a fairly large dose ($10^{13}$ to $10^{17}$ ions/cm$^2$) of a large atom group III element, such as B, Al, Ga or In at an energy between about 30 and 500 keV. The implant is followed by an implant of a large group V element, such as P, As, Sb, or Bi using similar doses and energies to the group III element. The group V element compensates the group III element. The combination of the two large atoms decreases the diffusivity of small atoms, such as B, in the implanted areas. Furthermore, the combination of the group III and group V elements in roughly equal proportions creates recombination sites and electron traps in the field oxide, resulting in a radiation hardened semiconductor device.

37 Claims, 4 Drawing Sheets

RADIATION HARDENING METHOD FOR SHALLOW TRENCH ISOLATION IN CMOS

BACKGROUND OF THE INVENTION

1. Technical Field

This invention pertains to CMOS integrated circuit processing, and, more particularly, to radiation hardening of shallow trench isolation ("STI") or local oxidation ("LOCOS") of a silicon field oxide region of an integrated circuit device, to prevent formation of leakage paths either within a device or to adjacent devices in high radiation environments.

2. Background Art

The field of radiation hardening in semiconductor devices deals in part with the problem of electron-hole pairs generated by the passage of ionizing radiation through the semiconductor devices. Electron-hole pairs generated in bulk silicon do not present a severe problem, because the electrons and holes recombine rapidly. Electron-hole pairs formed in silicon dioxide, however, are more difficult to deal with because the electrons are far more mobile than the holes and may become separated from the holes. This makes recombination more difficult and results in an accumulation of net positive charge in the silicon dioxide, or other dielectric film.

The conventional process for laterally isolating semiconductor circuits uses a field oxide between the active regions. One method of producing this field oxide is the shallow trench isolation or "STI" process. The STI process produces a recessed thick oxide layer separating adjacent semiconductor devices. This thick oxide layer is extremely susceptible to trapping positive charge in an ionizing radiation environment. This effect is cumulative and eventually results in lowering of the threshold voltage of the parasitic field oxide transistors occurring between adjacent transistors, such that these adjacent transistors are no longer isolated from one another.

N-channel transistors, formed in a P-well and separated by field oxide, are particularly affected by this phenomenon. The trapped positive charge in the field oxide repels positively charged carriers (holes) and attracts negatively charged carriers (electrons) in the surface of the underlying silicon layer. This accumulation of negatively charged carriers in the P-well adjacent to the field oxide causes inversion of the P-type silicon and creates a conductive channel or leakage path between N-doped drain and source regions of adjacent N-channel transistors. The accumulated negative charge in the P-well region can also create a leakage path from the source to drain of a single N-channel transistor, thus shorting out the N-channel transistor. But perhaps the most severe leakage path occurs between a P-well active region adjacent to an N-well active region, especially where polysilicon is used as an interconnect between both active regions. Thus, these undesirable parasitic transistors dominate circuit behavior and the circuit can no longer function as designed.

Conventionally, in the LOCOS process or variations thereof, the area that will be the field oxide region is implanted before growth of the field oxide with an ion dose that is calculated to suppress the operation of parasitic transistors under normal (no ionizing radiation) environments and operating conditions. The field oxide is conventionally grown by a wet thermal process. With the field implant process, there is a dopant gradient extending down into the substrate, with a high concentration at the surface changing to a background bulk concentration at some depth below the surface. The nature of the bulk silicon underlying the semiconductor circuit depends on the nature of the process used to fabricate the circuit, such as NMOS, PMOS, or CMOS processes. While this conventional method offers some protection against parasitic leakage paths under normal operating conditions, it is not possible to obtain the doping concentrations necessary to produce radiation hardened devices with acceptable performance for radiation doses greater than about 10 to 20 krad(Si).

Conventionally, in the STI process or variations thereof, the area that will be the field oxide region is etched out from the bulk silicon before deposition of the field oxide. A thin buffer oxide is conventionally grown by wet or dry processes to passivate the etched silicon surface and to reduce stress at the trench corners. There is no separate field oxide implant intended to suppress the operation of parasitic leakage paths under normal environmental and operating conditions. Multiple high energy implants are used to define the wells and threshold voltages of the transistors resident therein. While some measure of protection against parasitic leakage paths is achievable, it is still not possible to obtain the doping concentrations necessary to produce radiation hardened devices with acceptable performance for radiation doses greater than about 50 krad(Si).

Referring generally now to FIGS. 1–6, a conventional STI semiconductor process is shown in a series of cross-sectional drawing figures. In FIG. 1, a silicon substrate 10 is oxidized to form a thin silicon dioxide layer 12. A thicker $Si_3N_4$ layer 14 is formed on the surface of the silicon dioxide layer 12. In FIG. 2, trenches 16 are formed in each of layers 10, 12, and 14. In FIG. 3, a thick layer 18 of $SiO_2$ including thin thermal grown sides and bottom portions is conformally deposited over the surface of the integrated circuit, such that the trenches are completely filled with $SiO_2$. In FIG. 4, the thick layer 18 of $SiO_2$ is planarized to the surface of the oxide layer 12. In FIG. 5, a patterned photoresist layer 20 is formed, with an etched portion for forming an N-well in substrate 10. Multiple implants 22 are delivered to the substrate 10, such as phosphorous or arsenic implants as is known in the art. In FIG. 6, the N-well 28 is formed. Another patterned photoresist layer 24 is formed to allow implanting of a P-well through multiple implants 26.

In FIG. 6, dotted lines 30 and 32 are depth and lateral cross-sections through the N-well 28. In FIG. 7, the doping density is plotted along the depth of the N-well 28, which shows an initial doping density, which then increases, and then drops off quickly as the junction with the P-type substrate 10 is formed. In FIG. 8, the lateral doping density for one-half of the N-well is shown, wherein a constant doping density drops off underneath the field oxide isolation areas 18. While the N-well portion underneath the isolation area 18 has a fairly consistent doping density, the P-well underneath the field oxide 18 is more lightly doped due to the segregation of boron at the interface between the field oxide 18 and the P-well 10, and due to the much higher thermal diffusivity of boron compared to either phosphorous or arsenic. The P-well underneath the field oxide 18 is thus very lightly doped and is therefore a locus of parasitic leakage paths.

Referring now to FIG. 9, a finished STI integrated circuit includes a P-type substrate 10, an N-well 28, and a P-well 38. Silicon dioxide isolation areas 18 separate the N-well 28 and the P-well 38. Finally, polysilicon 34 completes a typical device, such as an inverter, wherein the gates of the N-channel and P-channel transistors are electrically connected using the polysilicon layer 34 as is known in the art in integrated digital or analog circuits.

The corresponding plan view is shown in FIG. 10. In FIG. 10, the P-well 28 includes a P+-type active area 42, as well as an N+-type N-well tie 40. The polysilicon gate 34 is also shown in FIG. 10. The N-well 38 includes an N+-type active area 44 as well as the polysilicon gate 34. Due to the low doping density underneath the field oxide isolation edge 18, there exists at least one leakage path 46 as shown, extending from the N-well tie 40 to the polysilicon gate 34. As previously explained, the conventional STI processes do not provide sufficient protection against undesirable parasitic leakage paths in an ionizing radiation environment. Additional leakage paths 47 between the source and drain of active area 44 are also shown, occurring near the surface of the integrated circuit under the field oxide 18.

What is desired, therefore, is an STI fabrication method for a radiation hardened semiconductor device capable of functioning in an ionizing radiation environment of approximately 100 krad(Si) or greater.

SUMMARY OF THE INVENTION

According to the present invention, in the first embodiment, the starting material is an epitaxial silicon wafer. The wafer is processed on a standard commercial CMOS process up to and including field oxidation. At a point in the process after field oxidation, but before final gate oxidation, a photoresist mask is patterned on the wafer such that the edges of P-well active areas are exposed, as well as most of the field oxide over P-well. The wafer is then implanted with a fairly large dose ($10^{13}$ to $10^{17}$ ions/cm$^2$) of a large atom group III element, such as Al, Ga or In at an energy between 30 and 1000 keV. The silicon underneath the field oxide is then heavily doped P-type. The implant may be followed by an implant of a large group V element, such as P, As, or Sb, using similar doses and energies to the group III element. The group V element compensates the group III element. The combination of the two large atoms decreases the diffusivity of small atoms, such as $^{11}$B$^+$, in the implanted areas. Furthermore, the combination of the group III and group V elements in roughly equal proportions creates recombination sites and electron traps in the field oxide, resulting in a radiation hardened semiconductor device. Optionally, the bottom and/or sidewalls of the shallow trench may be implanted with B or BF$_2$ as necessary to eliminate additional leakage paths.

In a second embodiment, the starting material is bulk silicon.

In a third embodiment, the starting material is an insulating substrate containing a thin silicon layer on top, such as silicon-on-insulator ("SOI") or silicon-on-sapphire ("SOS").

In a fourth embodiment, combinations of group II, group III, group IV, group V, and group VI elements are used to accomplish the intent of introducing electron traps in the field oxide while decreasing the diffusivity of small atom dopants in silicon, such as the sets: Si; Ge; Si, Ge; Cu, In, Se; Zn, Se; Cd, Se; Zn, S; Cd, Te;

Sn; etc.

In a fifth embodiment any of the preceding group II, group III, group IV, group V, or group VI elements can be incorporated as desired in the starting material using epitaxial growth methods.

The foregoing and other objects, features and advantages of the invention will become more readily apparent from the following detailed description of a preferred embodiment of the invention, which proceeds with reference to the accompanying drawings.

DETAILED DESCRIPTION

Figure 11:
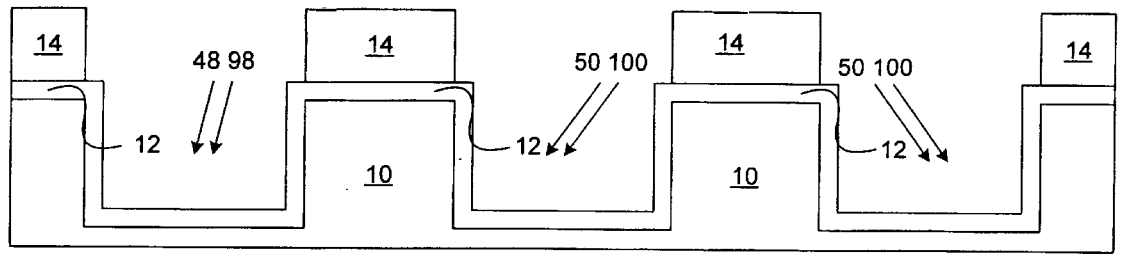
FIG. 11 is a cross-sectional diagram of an implant step according to the present invention.

Referring generally now to FIG. 11, in a first embodiment, the starting material is an epitaxial silicon wafer. Optionally, the starting material can be germanium-silicon (Ge—Si) epitaxy on silicon, wherein the maximum germanium concentration ideally occurs at the depth equivalent to the bottom of the STI trench. The wafer is processed on a standard commercial CMOS STI process up to and including definition of the shallow trenches.

At a point in the process after shallow trench formation, but before field oxidation, a photoresist mask is patterned on the wafer such that the edges of P-well active areas are exposed, as well as most of the field oxide over P-well. The wafer is then implanted with a fairly large dose ($10^{13}$ to $10^{17}$ ions/cm$^2$) of a large atom group III element or compound, such as B, BF$_2$, Al, Ga or In at an energy between 30 and 1000 keV. The implant may be followed by an implant of a large group V element, such as P, As, or Sb using similar doses and energies to the group III element. The group V element compensates the group III element as required to adjust the net P-type doping concentration and/or N-well to P-well reverse bias diode breakdown voltage. It is important to note that either the group III or the group V element can be implanted first. Optionally, the bottom of the trench can also be implanted with boron, or BF$_2$, as is discussed below in further detail.

In FIG. 11, a first group III implant 48 is made at an angle between 0 and 7 degrees from wafer normal (only into the P-well), reusing the P-well mask for the standard STI process. Secondly, four high angle group III implants 50 are made at an angle between 7 and 60 degrees from wafer normal. A 90 degree twist is made after each implant so that each of the four sides of the trench is implanted. It is important to note that either the first, the second, or both implant angles may be used.

Still referring to FIG. 11, a second group V implant 98 is made at an angle between 0 and 7 degrees from wafer normal (only into the P-well), reusing the P-well mask for the standard STI process. Secondly, four high angle group V implants 100 are made at an angle between 7 and 60 degrees from wafer normal. A 90 degree twist is made after each implant so that each of the four sides of the trench is implanted. It is important to note that either the first, the second, or both implant angles may be used.

In a second embodiment, the starting material can be bulk silicon, and the Ge—Si epitaxial starting material need not be used.

Figure 12:
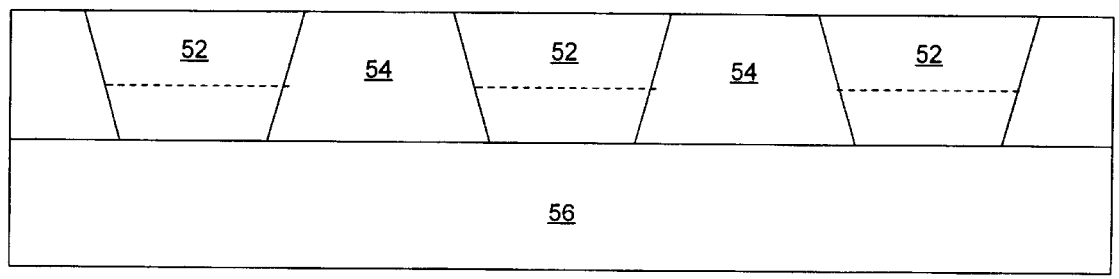
FIG. 12 is a cross-sectional diagram of an alternative substrate according to the present invention.
Figure 13:
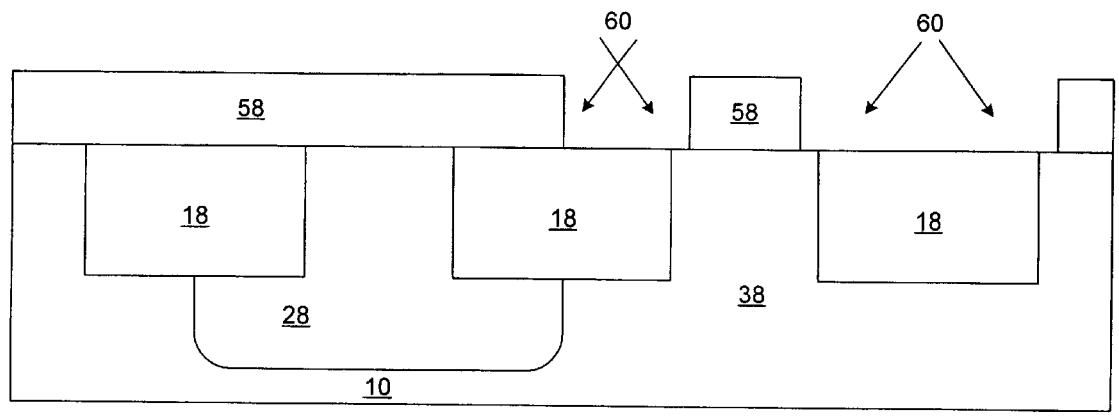
FIG. 13 is a cross-sectional diagram of an additional processing step according to the present invention.

In a third embodiment, shown in FIG. 12, the starting material is an insulating substrate 56 containing a thin silicon layer 54 on top, such as silicon-on-insulator ("SOI") or silicon-on-sapphire ("SOS"). The silicon layer is shown having oxide isolation areas 52. Insulating region 56 may or may not abut isolation area 52.

In a fourth embodiment, combinations of group II, group III, group IV, group V, and group VI elements are used to accomplish the intent of introducing electron traps in the field oxide while decreasing the diffusivity of small atom dopants in silicon, such as the sets: Si; Ge; Si, Ge; Cu, In, Se; Zn, Se; Cd, Se; Zn, S; Cd, Te; Sn; etc.

In a fifth embodiment any of the preceding group II, group III, group IV, group V, or group VI elements can be incorporated as desired in the starting material using epitaxial growth methods. In particular, germanium epitaxy on silicon (Ge—Si) can be used wherein the concentration of germanium in silicon varies between about $10^{17}$ to $10^{21}$ atoms/cm$^3$. The concentration of germanium can be constant or can vary as desired. Ideally, the concentration of germanium is maximized at the bottom of the trench. In general, the starting material in which the trench is formed is silicon and any group II, group III, group IV, group V, or group VI elements can be incorporated in the starting material substrate using epitaxial growth methods. Ideally, the concentration of the group II, group III, group IV, group V, or group VI elements is maximized at the bottom of the trench.

Figure 1:
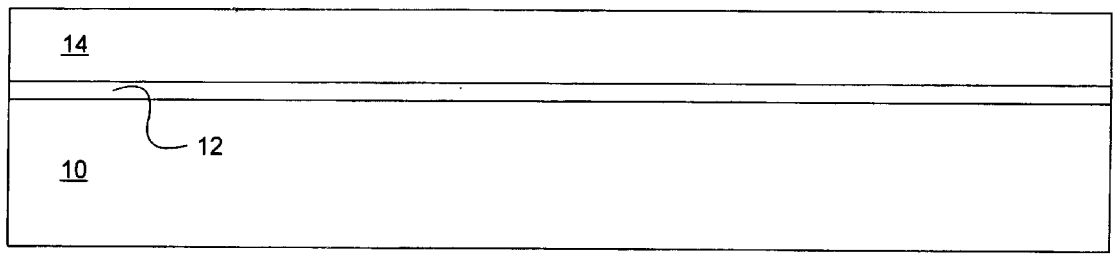
FIGS. 1–6 are cross-sectional diagrams corresponding to the fabrication steps of a prior art STI semiconductor process.
Figure 2:
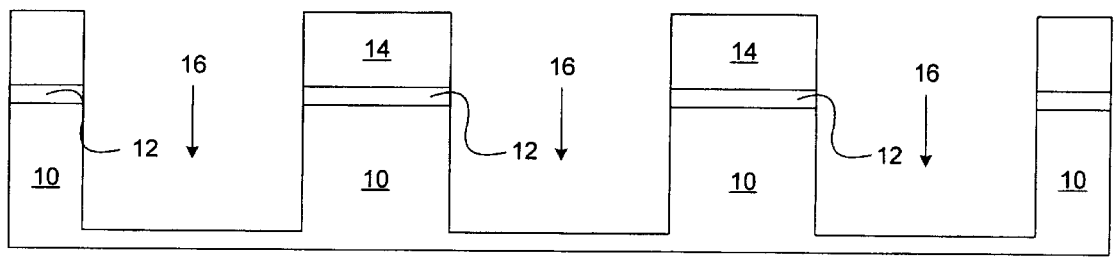
Figure 3:
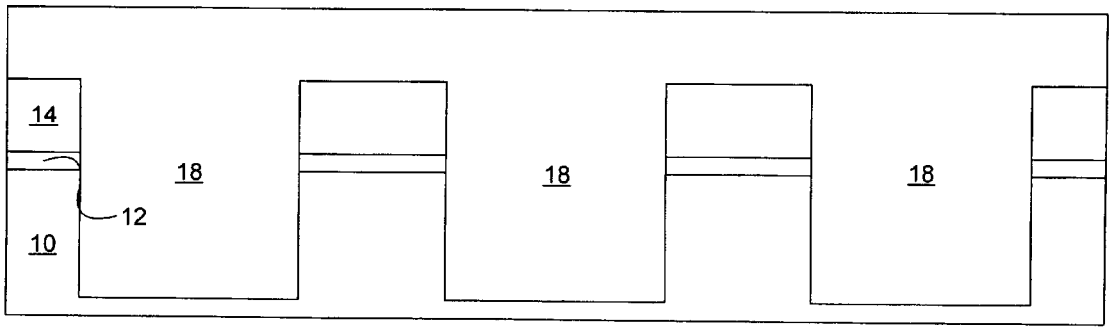
Figure 4:
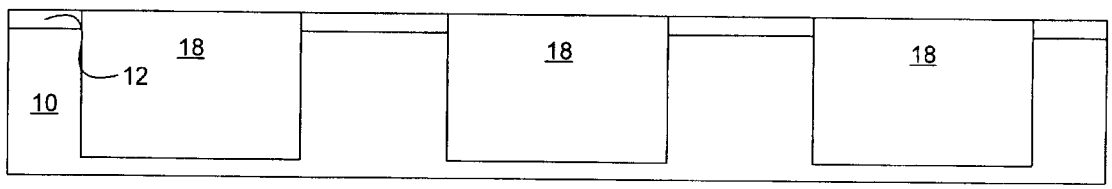
Figure 5:
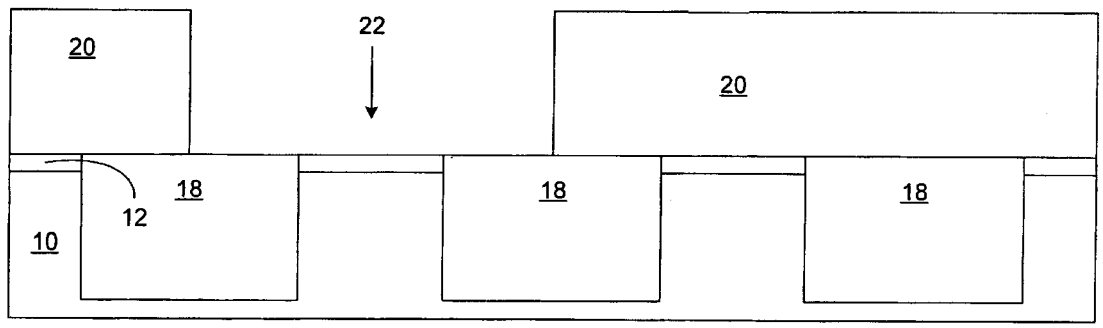
Figure 6:
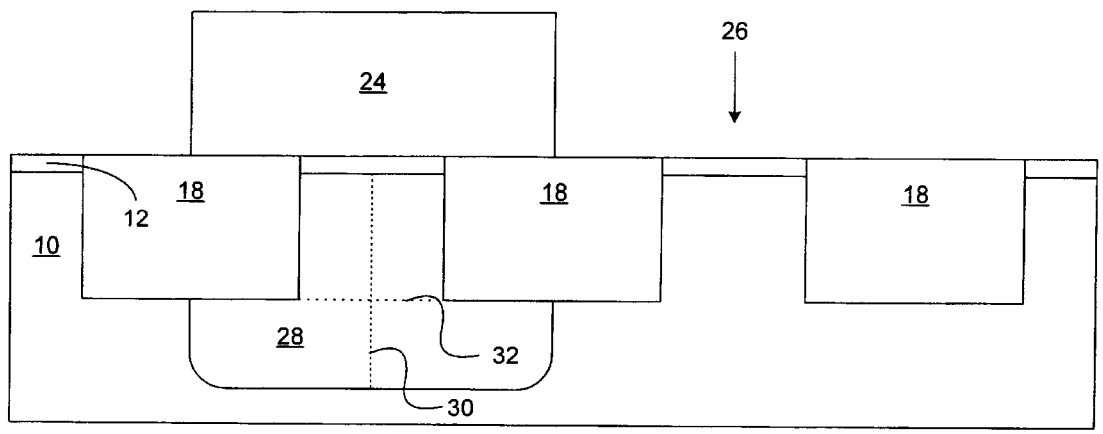
Figure 7:
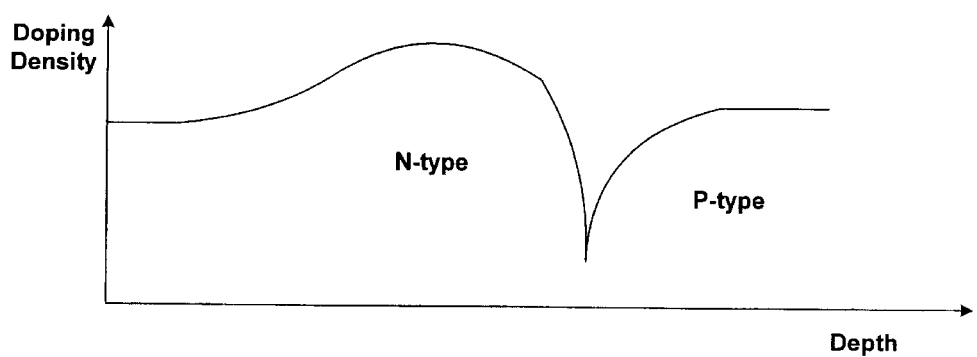
FIG. 7 is a doping profile along the depth of a prior art N-well.
Figure 8:
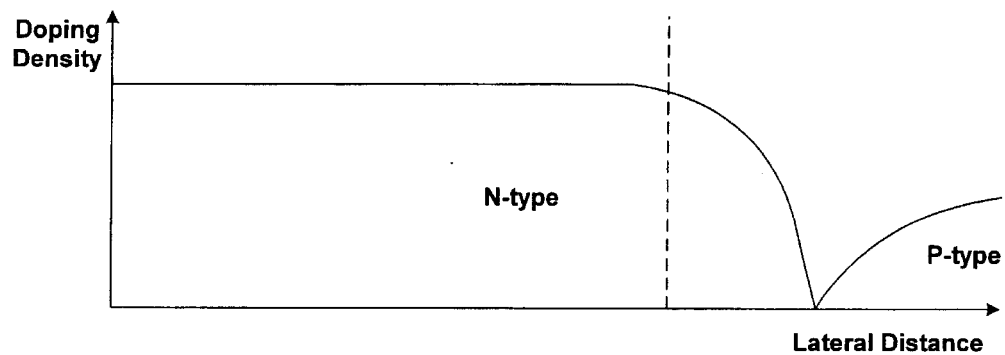
FIG. 8 is a lateral doping profile of the prior art N-well.
Figure 9:
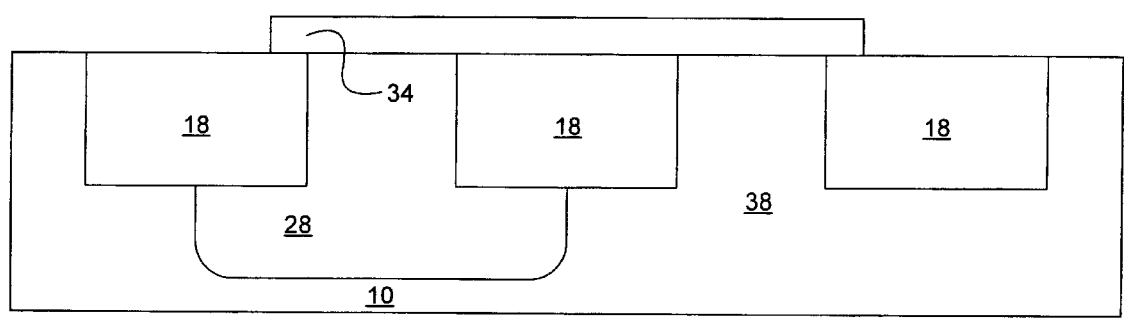
FIG. 9 is a cross-sectional diagram of a final step in the prior art STI semiconductor process.
Figure 10:
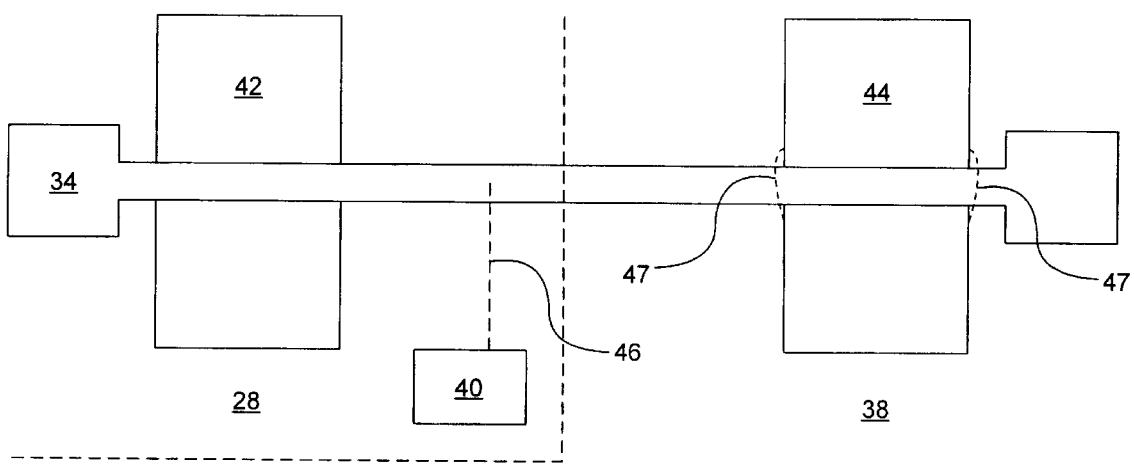
FIG. 10 is a plan view corresponding to the cross-sectional diagram of FIG. 9.

At a point in the process after field oxidation, but before final gate oxidation, a photoresist mask is patterned on the wafer such that the edges of P-well active areas are exposed, as well as most of the field oxide over P-well. The wafer is then implanted with a light dose ($10^{11}$ to $10^{14}$ ions/cm$^2$) of a group III element or compound, such as B, BF$_2$, Al, Ga or In at an energy between 0 and 100 keV for the purpose of eliminating additional leakage paths such as leakage path 47 shown in FIG. 10.

Having described and illustrated the principle of the invention in a preferred embodiment thereof, it is appreciated by those having skill in the art that the invention can be modified in arrangement and detail without departing from such principles. I therefore claim all modifications and variations coming within the spirit and scope of the following claims.

We claim:

1. A radiation-hardened shallow trench isolation semiconductor method comprising implanting a trench with a fairly large dose ($10^{13}$ to $10^{17}$ ions/cm$^2$) of a large atom group III element or compound after shallow trench formation, but before field oxidation.

2. The method of claim 1 further comprising implanting the trench with a fairly large dose ($10^{13}$ to $10^{17}$ ions/cm$^2$) of a large atom group V element or compound after field oxidation, but before final gate oxidation, either before or after the group III element implant.

3. The method of claim 1 further comprising implanting the trench with a light dose ($10^{11}$ to $10^{14}$ ions/cm$^2$) of a group III element or compound after field oxidation, but before final gate oxidation.

4. The method of claim 1 wherein the starting material in which the trench is formed is germanium epitaxy on silicon (Ge—Si).

5. The method of claim 1 wherein implanting the trench comprises implanting with an element or compound selected from the group including B, BF$_2$, Al, Ga or In.

6. The method of claim 1 wherein implanting the trench comprises implanting at an energy between 30 and 1000 keV.

7. The method of claim 2 in which the additional implant comprises an implant of an element selected from the group including P, As, Sb, or Bi.

8. The method of claim 2 in which the additional implant is implanted at an energy between 30 and 1000 keV.

9. The method of claim 2 in which the ratio of the group III to the group V element is unequal to provide a controlled, net P-type doping in the implanted silicon region.

10. The method of claim 2 in which the ratio of the group III to the group V element is equal.

11. The method of claim 1 wherein implanting the trench comprises a group III implant made at an angle between 0 and 7 degrees from wafer normal into a P-well trench.

12. The method of claim 1 wherein implanting the trench comprises at least one high angle group III implant.

13. The method of claim 12 in which the high angle group III implant comprises four implants made at a 90 degree twist after each implant so that each of the four sides of the trench are implanted.

14. The method of claim 12 in which the high angle group III implant comprises at least one implant made at an angle between 7 and 60 degrees from wafer normal.

15. The method of claim 2 wherein implanting the trench comprises a group V implant made at an angle between 0 and 7 degrees from wafer normal into a P-well trench.

16. The method of claim 2 wherein implanting the trench comprises at least one high angle group V implant.

17. The method of claim 16 in which the high angle group V implant comprises four implants made at a 90 degree twist after each implant so that each of the four sides of the trench are implanted.

18. The method of claim 16 in which the high angle group V implant comprises at least one implant made at an angle between 7 and 60 degrees from wafer normal.

19. The method of claim 1 in which the starting material comprises bulk silicon.

20. The method of claim 1 in which the starting material comprises silicon-on-insulator ("SOI").

21. The method of claim 1 in which the starting material comprises silicon-on-sapphire ("SOS").

22. The method of claim 1 further comprising an additional implant taken from the group consisting of: group II, group III, group IV, group V, and group VI elements either singly or in combination in order to introduce electron traps in the field oxide while decreasing the diffusivity of small atom dopants in silicon.

23. The method of claim 22, in which the additional implant comprises Si.

24. The method of claim 22, in which the additional implant comprises Ge.

25. The method of claim 22, in which the additional implant comprises Si and Ge.

26. The method of claim 22, in which the additional implant comprises Cu, In, and Se.

27. The method of claim 22, in which the additional implant comprises Zn and Se.

28. The method of claim 22, in which the additional implant comprises Cd and Se.

29. The method of claim 22, in which the additional implant comprises Zn and S.

30. The method of claim 22, in which the additional implant comprises Cd and Te.

31. The method of claim 22, in which the additional implant comprises Sn.

32. The method of claim 22, in which group II, group III, group IV, group V, or group VI elements are incorporated in a starting material substrate using epitaxial growth methods.

33. A radiation-hardened shallow trench isolation semiconductor method comprising forming a trench wherein the starting material in which the trench is formed is germanium epitaxy on silicon (Ge—Si).

34. The method of claim 33 in which the concentration of germanium in silicon varies between about $10^{17}$ to $10^{21}$ atoms/cm$^3$.

35. The method of claim 33 in which the concentration of germanium is maximized at the bottom of the trench.

36. A radiation-hardened shallow trench isolation semiconductor method comprising forming a trench wherein the starting material in which the trench is formed is silicon in which group II, group III, group IV, group V, or group VI elements are incorporated in a starting material substrate using epitaxial growth methods.

37. The method of claim 36 in which the concentration of the group II, group III, group IV, group V, or group VI elements is maximized at the bottom of the trench.

* * * * *